United States Patent [19]

Terasawa et al.

[11] Patent Number: 4,597,669
[45] Date of Patent: Jul. 1, 1986

[54] PATTERN DETECTOR

[75] Inventors: Tsuneo Terasawa, Hachioji; Shinji Kuniyoshi, Suginami; Akihiro Takanashi, Kokubunji; Toshiei Kurosaki, Edogawa; Yoshio Kawamura, Koutou; Sumio Hosaka, Nishitama, all of Japan

[73] Assignee: Hitachi, Ltd., Tokyo, Japan

[21] Appl. No.: 539,760

[22] Filed: Oct. 7, 1983

[30] Foreign Application Priority Data

Oct. 18, 1982 [JP] Japan ............................ 57-181337

[51] Int. Cl.$^4$ ...................... G01N 21/86; G01B 11/00
[52] U.S. Cl. .................................. 356/401; 356/400; 250/548
[58] Field of Search ............... 356/400, 401, 375, 373; 250/557, 571, 203 R, 548

[56] References Cited

U.S. PATENT DOCUMENTS

| | | | |
|---|---|---|---|
| 3,514,612 | 5/1970 | Graffenried | 73/65 |
| 4,115,762 | 9/1978 | Akiyama et al. | 250/201 |
| 4,380,395 | 4/1983 | Kuniyoshi et al. | 356/401 |

Primary Examiner—R. A. Rosenberger
Assistant Examiner—Crystal Cooper
Attorney, Agent, or Firm—Antonelli, Terry & Wands

[57] ABSTRACT

A pattern detector according to the present invention adopts a processing method wherein means is provided anew with which the intensity distribution of light reflected from or transmitted through an illuminated specimen is photoelectrically converted, and a pattern position is detected at high speed from the ratio between the primary moment and integral value of a detection signal thus derived, whereupon a symmetry calculation is executed within a narrow range around the detected value, whereby the pattern position is found fast and precisely.

3 Claims, 12 Drawing Figures

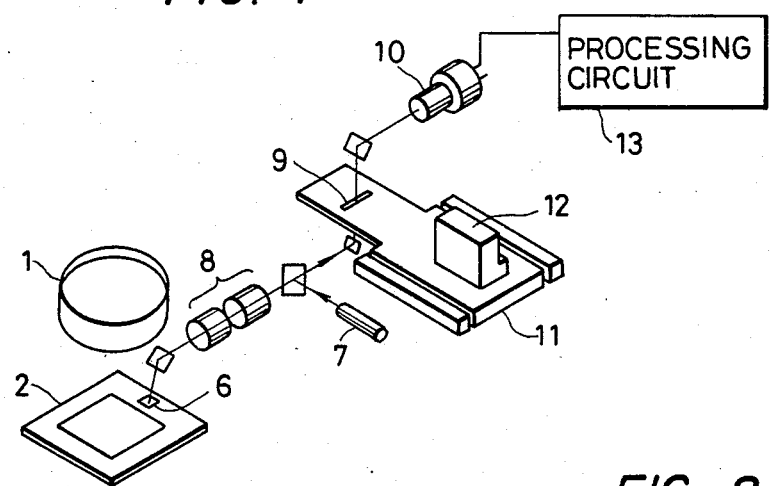
FIG. 1
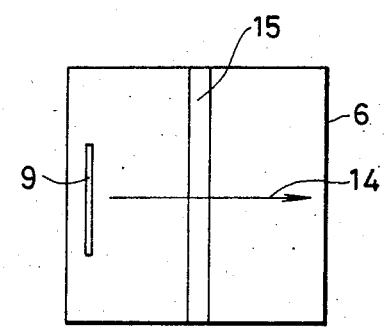
FIG. 2
FIG. 3A
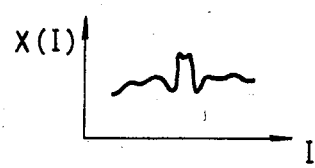
FIG. 3B
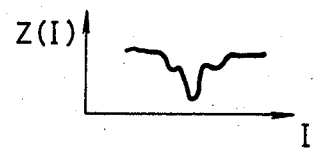

FIG. 4
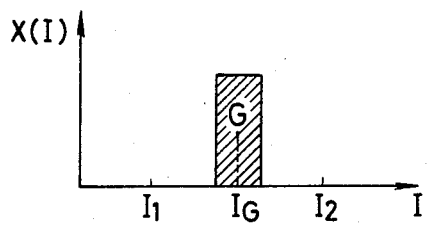
FIG. 5A
FIG. 5B
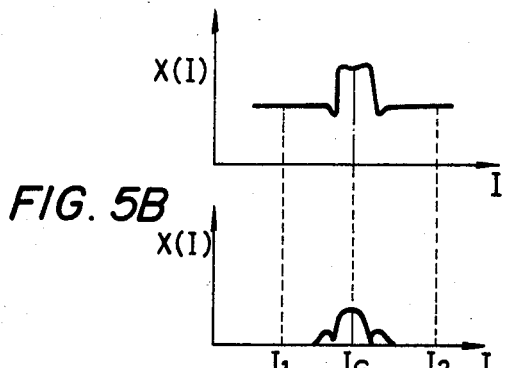
FIG. 7A
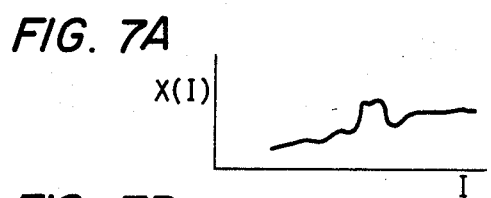
FIG. 7B
FIG. 7C
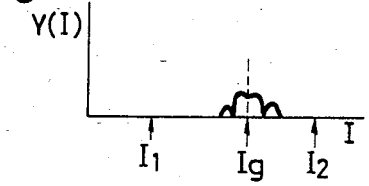
FIG. 8
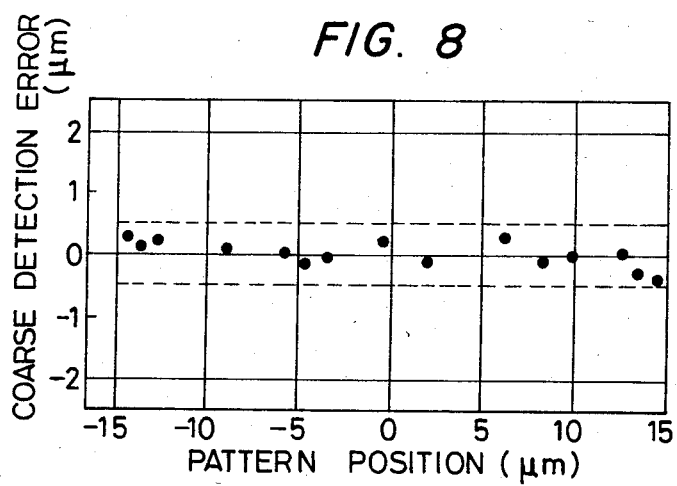

PATTERN DETECTOR

BACKGROUND OF THE INVENTION

The present invention relates to improvements in a pattern detector in an exposure system such as a reduction projection aligner system for use in processes for producing semiconductor integrated circuits, the pattern detector being well suited to precise positional measurements for the positioning of wafers, masks etc.

FIG. 1 shows an example of a prior-art pattern detector used in a reduction projection aligner system (refer to U.S. Pat. No. 4,380,395). In the reduction projection aligner system, a reticle 2 which is the original of a circuit pattern is illuminated by an illuminating optical system 1, to form a pattern on a wafer 4 through a reduction lens 3. At this time, the new pattern needs to be formed in conformity with the position of a pattern 5 which has been formed on the wafer 4 by the preceding step. The detection of a wafer position therefor has been effected by the following method. Using a light source 7 guided by an optical fiber or the like, a positioning pattern on the wafer 4 is illuminated through a reference pattern 6 on the reticle 2 and the reduction lens 3. Reflected light passes through a magnifying optical system 8 to be magnified and focused on the moving plane of a carriage 11 which has a slit 9. While the focusing plane is being scanned by the slit 9 so as to measure the movement value of this slit 9 by means of a linear encoder 12, the brightness of light passing through the slit is converted into an electric signal by a photomultiplier 10. FIG. 2 shows an example of the positioning pattern 15 of the wafer projected on the slit 9 (in the figure, numeral 14 indicates the scanning direction of the slit). Herein, when the photoelectric conversion output is taken on the axis of ordinates and the coordinate of the slit position on the axis of abscissas, a detection signal (derived signal) as shown in FIG. 3A is obtained.

In order to find the pattern position from the detection signal, there has heretofore been employed a method in which whether the symmetry of the detection signal is good or bad is decided by a processing circuit 13 (refer to the official gazette of Japanese Laid-open Patent Application No. 53-69063 corresponding to U.S. Pat. No. 4,115,762). More specifically, a function indicative of the degree of the symmetry as shown in FIG. 3B:

$$Z(I) = \sum_{j=1}^{m} \{X(I-j) - X(I+j)\}^2 \quad (1)$$

is evaluated by the use of a detection value X(I) obtained at a slit position I, and the position I at which the function becomes the minimum is deemed the pattern position. With this method, the detection signals X(I) for, e.g., 2500 points I are once stored in a memory, whereupon Equation (1) is calculated for the points I within a specified range by the use of a computer. The calculation of Equation (1) has the advantage of being less susceptible to the noise of the signal, but it has the disadvantage of requiring a long processing time because of a large number of operating steps. By way of example, when the resolution of the pattern detector is supposed to be 0.04 $\mu$m as reckoned on the wafer and the calculation of Equation (1) is executed for the points I within a detection range of $\pm 5$ $\mu$m by a minicomputer of the type ordinarily used (for example, "HITAC 10II", a product of Hitachi Ltd.), the processing time becomes about 0.7 second at m=200. However, a wider detection range is desired when the pattern detector is used in the reduction projection aligner system. In this regard, when the above method is applied to a detection range of $\pm 15$ $\mu$m, the processing time becomes about 9 times longer, which becomes a factor for the degradation of the performance of the system. Especially in case of positioning each of a number of chips formed on the wafer, the long processing time forms a cause for lowering the wafer processing capability of the reduction projection aligner system. It has therefore been desired to shorten the processing time which is taken for the positional measurement.

SUMMARY OF THE INVENTION

An object of the present invention is to provide in signal processing for obtaining a pattern position from derived detection signals, a pattern detector which includes means capable of reducing the number of symmetry calculations required, thereby effecting a processing of the pattern detection signals at high speed.

In order to accomplish this object, according to the present invention, a pattern detector has a detection signal deriving portion in which a specimen is illuminated, whereupon an intensity distribution of light reflected from or transmitted through the specimen is photoelectrically converted and then derived as a detection signal, and a processing portion which executes signal processing for measuring a specimen position from the derived detection signal is so constructed that it comprises a portion for calculating a centroid of the detection signal, the centroid calculating portion including means to calculate a primary moment of the detection signal, means to calculate an integral value thereof, and means to divide the primary moment by the integral value, and a symmetry calculating portion which precisely detects the specimen position near the centroid of the detection signal calculated by said centroid calculating portion.

BRIEF DESCRIPTION OF THE DRAWINGS:

FIG. 1 is an explanatory view showing an example of the construction of a prior-art pattern detector;

FIG. 2 is a view showing an example of the positioning pattern of a wafer projected on a slit;

FIGS. 3A and 3B are diagrams showing a derived signal and a processed signal in the prior art, respectively;

FIG. 4 and FIGS. 5A and 5B are signal waveform diagrams each serving to explain the principle of the present invention;

FIGS. 7A, 7B and 7C are waveform diagrams of signals processed by the present invention; and FIG. 8 is a diagram showing the accuracy of coarse detection performed by the present invention.

DETAILED DESCRIPTION OF THE PREFERRED EMBODIMENTS

Figure 6:
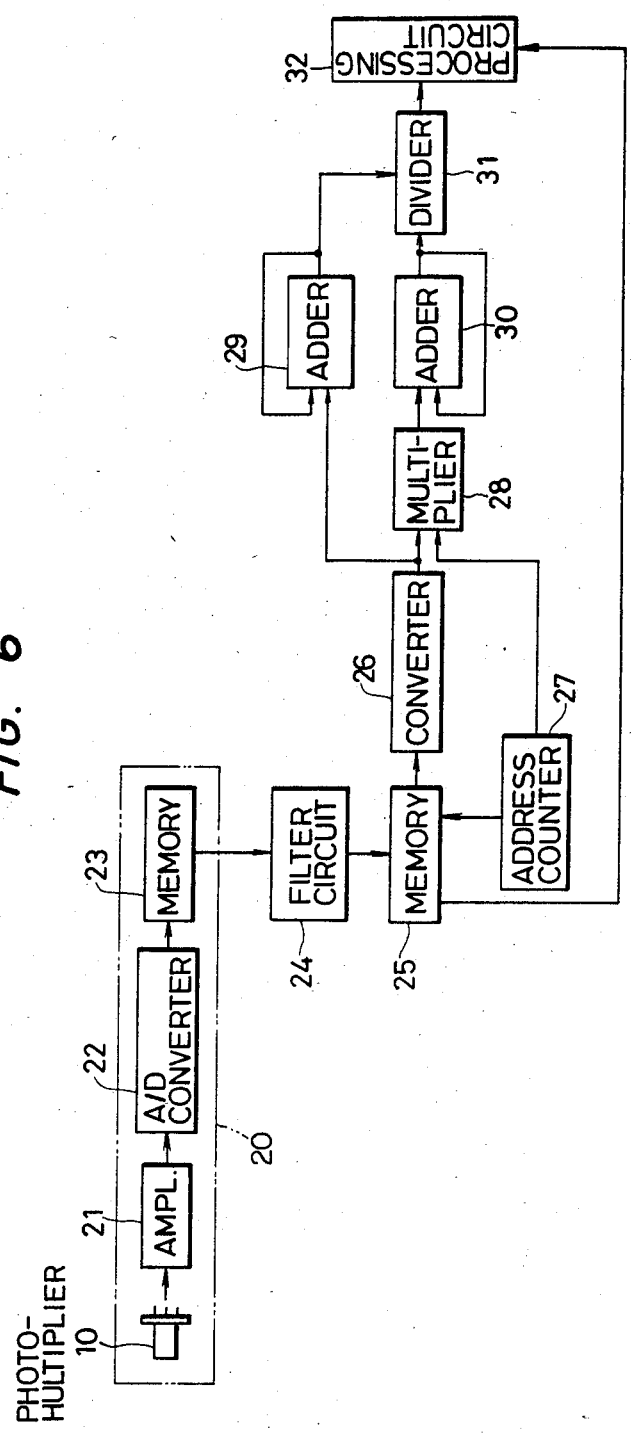
FIG. 6 is a block diagram showing a signal processing circuit in the present invention.

First, the principle of the present invention will be described with reference to the drawings. FIG. 4 shows a detection signal of rectangular waveform which produces a significant signal level from only a part of the pattern. Here, it can be considered that the central position of the pattern is the I coordinate of the center of gravity or centroid G of a figure (hatched part) enclosed with the signal waveform and a coordinate axis. Assuming that the moment calculation region of the pattern is $I_1 \leq I \leq I_2$, the following holds in light of the definition of the centroid:

$$I_G = \left\{ \int_{I_1}^{I_2} X(I) \cdot I \, dI \right\} / \left\{ \int_{I_1}^{I_2} X(I) \, dI \right\} \quad (2)$$

When the signal to be obtained is a digital value, the integral indication of Equation (2) may be replaced with addition indication. That is:

$$I_G = \left\{ \sum_{I=I_1}^{I_2} X(I) \cdot I \right\} / \left\{ \sum_{I=I_1}^{I_2} X(I) \right\} \quad (3)$$

The numerator and denominator of Equation (2) shall be respectively called the "primary moment" and "integral value" of the detection signal waveform.

As an actual detection signal, a signal corresponding to a background level is also derived from a part other than the pattern part as illustrated in FIG. 5A. In this case, the pattern position is found by passing the detection signal through a filter (noise removing calculation circuit) for removing the low frequency component of the detection signal, to take out a signal indicative of only the signal variation of the pattern part as illustrated in FIG. 5B, whereupon Equation (3) is applied.

Now, the present invention will be described in detail in conjunction with an embodiment. In the embodiment, the absolute value of the detection signal with the low frequency component removed therefrom is stored in a memory, whereupon the sum of the values of such signals stored in the memory, namely, the integral value of the signals, and the sum of the products between the values of the signals and counter values indicative of memory addresses storing them, namely, the primary moment of the signals are respectively evaluated, and a value with the latter divided by the former is obtained. The quotient value denotes the approximate value of the pattern position. Lastly, a symmetry calculation is executed within a narrow range centering round the approximate value. Such processing method is adopted.

FIG. 6 shows a block diagram of a pattern detection signal processing circuit illustrative of the embodiment of the present invention. Referring to the figure, numeral 20 designates a detection signal deriving portion wherein the output of a photomultiplier 10 is passed through an amplifier 21 and is converted by an A/D (analog-to-digital) converter 22 into a digital value, which is stored in a memory 23. FIG. 7A shows the derived signal X(I) stored. Here, X(I) indicated the digital value stored in the I-th memory address. The signal X(I) includes, not only a minute variation of brightness based on a pattern step on a wafer, but also brightness variations at low frequencies because, in general, equal-thickness interference fringes appear with a variation in the thickness of a photoresist applied on the wafer. In order to remove the low frequency component, therefore, a low frequency component-removing calculation circuit or filter circuit 24 is used for executing the following calculation:

$$XC(I) = X(I) - \frac{1}{2n-1} \sum_{j=1}^{2n-1} X(I - n + j) \quad (4)$$

where $n \approx 100$ (empirically, when n is selected at about this value, the low frequency component unnecessary for the signal processing can be removed). Thus, the signal XC(I) which includes only the brightness variation based on the pattern step is stored in a memory 25. FIG. 7B shows the detection signal XC(I) stored in the memory 25.

Next, a converter circuit 26 which finds the absolute value of the detection signal in a memory address previously appointed is used for obtaining the absolute value of XC(I) and for subtracting from the absolute value signal a fixed value corresponding to the signal level of the part other than the pattern, namely, the signal level of the noise component. If the difference is a negative value, zero is substituted therefor. In a case where the noise component is small relative to the variation of the derived signal, this processing is not always necessary and may well be omitted.

When Y(I) denotes the signal subjected to the above processing, it has a waveform shown in FIG. 7C. The signal Y(I) need not be stored in a memory, but it may be evaluated from the signal XC(I) each time a calculation to be mentioned below is executed.

Numeral 27 in FIG. 6 designates a counter which specifies the address of the memory. For all the storage addresses I within $I_1 \leq I \leq I_2$ previously appointed, the following calculation is executed by a multiplier circuit 28:

$$Y_1(I) = Y(I) \times I \quad (5)$$

Further, $Y_1(I)$ and $Y(I)$ are added by adder circuits 29 and 30. The added results respectively denoted by M and S are supplied to a calculation circuit (divider circuit) 31 so as to evaluate:

$$I_g = M/S = \left( \sum_{I=I_1}^{I_2} Y(I) \times I \right) / \left( \sum_{I=I_1}^{I_2} Y(I) \right) \quad (6)$$

where M corresponds to the primary moment of the signal Y(I) and S to the integral value thereof, and $I_g$ indicates the center of gravity or centroid of a figure enclosed with the signal Y(I) and a coordinate axis. The detection of the value close to the true pattern position (coarse detection) ends when the division of Equation (6) has been executed once.

In an example of the embodiment, signals were derived over a width of 40 μm on a wafer, and the position of a pattern having a width of 6 μm was calculated. As a result of the experiment, it has been confirmed that, wherever the pattern lies within a detection range of ±15 μm, $I_g$ given by Equation (6) lies within a range of ±1 μm about the true pattern position.

FIG. 8 exemplifies the accuracy of the coarse detection according to the present invention, that is, the relationship between the pattern position and the detection error of the detection value $I_g$.

As a method for finding the precise position of the pattern, the calculation of Equation (1) for estimating the quality of the symmetry in the prior art may be executed. The detection signals stored in the memory 25 are subjected to the calculation by a processing circuit (symmetry calculating portion) 32. Since, in this case, the range of the tentative center I for computing Equation (1) can be narrowed to ±1 μm or so, the period of time taken for the symmetry calculation becomes about 1/5.

In the present embodiment, the computing range of the symmetry calculation can be made as narrow as ±1 m by finding the centroid of the detection signal, and hence, the processing time has been shortened in comparison with that of the prior-art method which performs the symmetry calculation over a range of ±5 μm. Further, when the symmetry calculation in the prior art is directly performed with the detection range widened to ±15 μm, the processing range and the addition width m of Equation (1) become three times respectively, so that the processing time becomes about nine times. In contrast, in the present embodiment, wherever the pattern lies within the range of ±15 μm, the position can be detected in a short time.

In the present embodiment, the method of removing the low frequency component in accordance with Equation (4) is adopted for evaluating the detection signal XC(I) indicative of only the variation of brightness based on the pattern step. As mentioned before, signal X(I) in Equation (4) is the signal which is derived from the detection signal deriving portion 20. However, another method is also considered for taking out the detection signal indicative of only the high frequency component. For example, even when the difference signal (differentiated signal) of the derived signal is stored in the memory 25 as a detection signal, a similar effect is obtained.

In the present invention, the expedient for obtaining the intensity distribution of light reflected from or transmitted through the specimen is not restricted to the slit scanning described before, but such means as a linear sensor and a TV camera are also applicable.

As set forth above, according to the present invention, wherever the position of a pattern to be detected lies within a detection range, it can be detected within a narrow range of approximately ±1 μm owing to a calculation for evaluating the centroid of a figure which is enclosed with a detection signal and a coordinate axis. As a result, a range for executing the symmetry calculation (1) which has heretofore required the longest processing time can be narrowed to ±1 μm or so, and the shortening of the calculative processing time can be realized.

What is claimed is:

1. A pattern detector comprising:
   a detection signal deriving portion in which a specimen is illuminated, whereupon an intensity distribution of light reflected from or transmitted through the specimen is photoelectrically converted and then derived as a detection signal; and
   a processing portion which executes signal processing for measuring a specimen position from the derived detection signal;
   wherein said processing portion comprises (a) means for calculating a centroid of the detection signal, including means for calculating a primary moment of the detection signal, means for calculating an integral value of the detection signal, and means for dividing the primary moment by the integral value; and (b) a symmetry calculating portion which detects the specimen position near the centroid of the detection signal calculated by said centroid calculating means.

2. A pattern detector as defined in claim 1, wherein said detection signal deriving portion includes an A/D converter which converts a photoelectric signal into a digital value, and a memory which stores the value of the A/D-converted detection signal.

3. A pattern detector as defined in claim 2, wherein said primary moment calculating means includes a multiplier circuit which multiplies the value of the signal stored in said memory and a counter value indicative of an address of said memory which stores the detection signal, and an adder circuit which adds the multiplied results.

* * * * *